United States Patent
Lin

(10) Patent No.: US 7,008,730 B2
(45) Date of Patent: Mar. 7, 2006

(54) APPLICATION OF HIGH TRANSMITTANCE ATTENUATING PHASE SHIFTING MASK WITH DARK TONE FOR SUB-0.1 MICROMETER LOGIC DEVICE CONTACT HOLE PATTERN IN 193 NM LITHOGRAPHY

(75) Inventor: Cheng-Ming Lin, Yunlin (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 3 days.

(21) Appl. No.: 10/338,118

(22) Filed: Jan. 7, 2003

(65) Prior Publication Data

US 2004/0131978 A1    Jul. 8, 2004

(51) Int. Cl.
G03F 9/00    (2006.01)
G03C 5/00    (2006.01)

(52) U.S. Cl. .................... 430/5; 430/322; 430/396
(58) Field of Classification Search .............. 430/5, 430/322, 324, 323, 396
See application file for complete search history.

(56) References Cited

U.S. PATENT DOCUMENTS

| | | | |
|---|---|---|---|
| 5,503,951 A | 4/1996 | Flanders et al. | 430/5 |
| 5,786,114 A | 7/1998 | Hashimoto | 430/5 |
| 5,916,712 A | 6/1999 | Miyashita et al. | 430/5 |
| 6,277,528 B1 | 8/2001 | Tzu et al. | 430/5 |
| 6,294,295 B1 * | 9/2001 | Lin et al. | 430/5 |

OTHER PUBLICATIONS

Petersen et al., "Assessment of a Hypothetical Roadmap that Extends Optical Lithography Through the 70nm Technology Node," Part of the BACKS Symp. on Photo mask tech. & Management, SPIE vol. 3546, Sep. 1998, pp. 288-303.

* cited by examiner

Primary Examiner—Saleha R. Mohamedulla
(74) Attorney, Agent, or Firm—Thomas, Kayden, Horstemeyer & Risley

(57) ABSTRACT

An attenuating phase shifting mask for forming contact holes in a layer of negative resist, a method of forming the mask, and a method of forming the contact holes are described. The mask is formed from a mask blank having a layer of attenuating phase shifting material formed on a transparent mask blank. The attenuating phase shifting material has a transmittance of greater than 20% and between about 20% and 50% for light having a wavelength of 193 nanometers. The mask is a dark tone mask having mask elements formed of the attenuating phase shifting material at the locations of the mask corresponding to the locations of the contact holes. The mask is used to expose a layer of negative resist which is then developed to form the contact holes.

28 Claims, 5 Drawing Sheets

APPLICATION OF HIGH TRANSMITTANCE ATTENUATING PHASE SHIFTING MASK WITH DARK TONE FOR SUB-0.1 MICROMETER LOGIC DEVICE CONTACT HOLE PATTERN IN 193 NM LITHOGRAPHY

BACKGROUND OF THE INVENTION (1) Field of the Invention

This invention relates to the use of high transmittance dark tone attenuating phase shifting masks to form contact holes in a layer of negative resist wherein the contact holes have a width and separation in the 0.1 or above micrometer range.

(2) Description of the Related Art

The use of attenuating phase shifting material in photolithography is frequently used in the fabrication of integrated circuit wafers having small critical dimensions.

U.S. Pat. No. 6,277,528 B1 to Tzu et al. describes a method of forming a high transmittance attenuated phase shifting mask blank.

U.S. Pat. No. 5,916,712 to Miyashita et al. describes half tone phase shifting photomasks which have high transmittance for light having a wavelength of 248 nanometers.

U.S. Pat. No. 5,503,951 to Flanders et al. describes an attenuating phase shifting mask having recessed phase shifting and phase shifting regions that is not susceptible to phase defects in the printing regions of the mask.

U.S. Pat. No. 5,786,114 to Hashimoto describes an attenuated phase shift mask with boundary regions formed from the halftone material used to form the circuit pattern regions of the mask. The halftone material in the boundary regions are shielded from a stabilization treatment of the halftone material used to stabilize the transmittance of the halftone material at a higher optimum level.

SUMMARY OF THE INVENTION

As dimensions become smaller in semiconductor integrated circuit fabrication it becomes necessary to form contact holes having a width in the range of 0.1 micrometers and a spacing between adjacent holes of about 0.1 or above micrometers. Light sources producing light having a 193 nanometer wavelength are frequently used in these applications. Attenuating phase shifting masks are frequently used to form these contact holes. To form contact holes with these dimensions using 193 nanometer light requires attenuating phase shifting materials having a higher transmittance than was previously required. However, in using these higher transmittance attenuating phase shifting masks side lobe exposure becomes a problem. In addition it is important to have masks which provide sufficient depth of focus in order to provide adequate process latitude.

It is a principle objective of this invention to provide a method of forming a contact hole mask having high transmittance attenuating phase shifting material which will provide good depth of focus and avoid the problem of side lobe exposure.

It is another principle objective of this invention to provide a method of forming contact holes in a layer of resist, using a contact hole mask having high transmittance attenuating phase shifting material, which will provide a good depth of focus and avoid the problem of side lobe exposure of the layer of resist.

It is another principle objective of this invention to provide a contact hole mask having high transmittance attenuating phase shifting material which will provide good depth of focus and avoid the problem of side lobe exposure.

These objectives are achieved by forming dark tone attenuating phase shifting masks to expose a layer of negative resist wherein the contact holes remain unexposed and the remainder of the layer of resist is exposed. The mask is formed from a mask blank having a layer of attenuating phase shifting material formed on a transparent mask substrate. The attenuating phase shifting material has a transmittance of between about 20% and 50% for the light being used to expose the layer of resist. Typically the transmittance of the phase shifting material is between about 20% and 50% for light having a wavelength of 193 nanometers. The attenuating phase shifting material is used to form a dark tone mask having mask elements formed of the attenuating phase shifting material at the locations of the mask corresponding to the locations of the contact holes. The dark tone mask is used to expose a layer of negative resist leaving the resist at the location of the contact holes unexposed. The layer of resist is then developed to form the contact holes. Using the dark tone mask to expose a layer of negative resist avoids side lobe problems and provides a depth of focus of +/−0.3 micrometers. Typically the attenuating phase shifting material used comprises aluminum oxide or nitride-based material.

DESCRIPTION OF THE PREFERRED EMBODIMENTS

Figure 1:
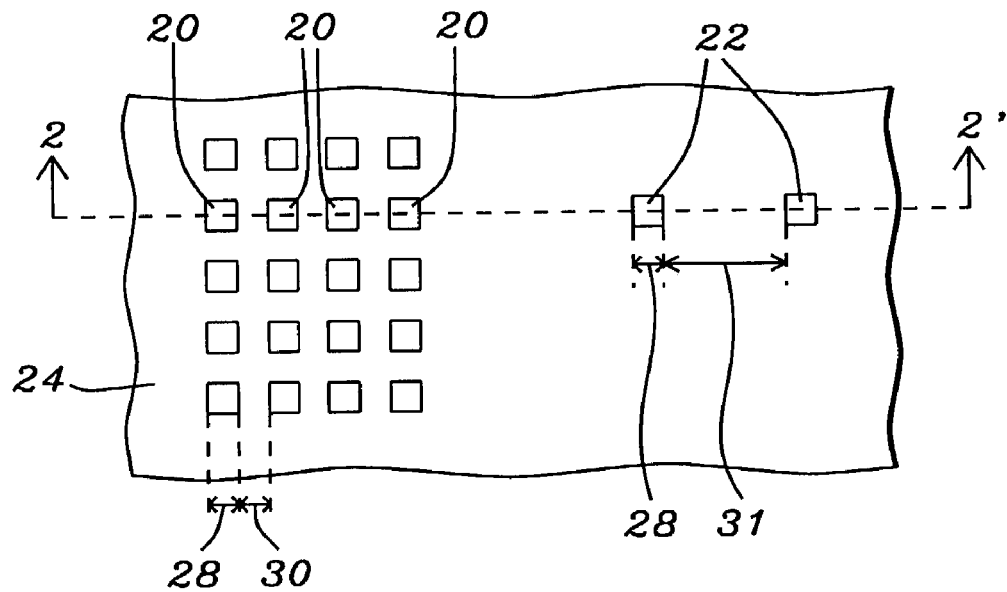
FIG. 1 shows a top view of a desired contact hole pattern in a layer of resist.

Refer now to FIGS. 1–7 for a description of the preferred Embodiments for the method of forming contact holes, method of forming a contact hole mask, and contact hole mask of this invention. FIG. 1 shows a top view of a segment of a layer of resist 24 having closely spaced contact holes 20 and isolated contact holes 22 formed therein. The closely spaced contact holes 20 and the isolated contact holes 22 have a first width 28. In this example the first width 28 is about 0.1 micrometers. The space 30 between adjacent closely spaced contact holes is about 0.1 or above micrometers. The space 31 between adjacent isolated contact holes 22 is at least 0.5 micrometers.

Figure 2:
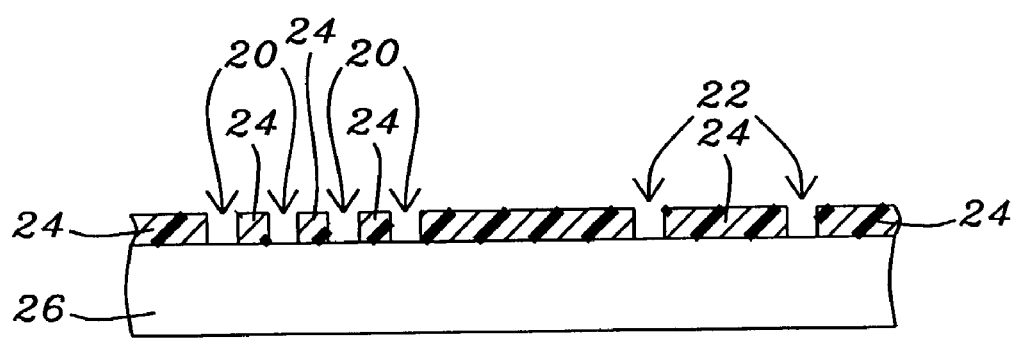
FIG. 2 shows a cross section view of a contact hole pattern in a layer of resist taken along line 2–2' of FIG. 1.

FIG. 2 shows a cross section view of the layer of resist 24 with contact holes formed therein taken along line 2–2' of FIG. 1. As shown in FIG. 2 the layer of resist is formed on a substrate 26. Typically, but not necessarily, the substrate is a semiconductor integrated circuit wafer having devices formed therein.

Figure 3A:
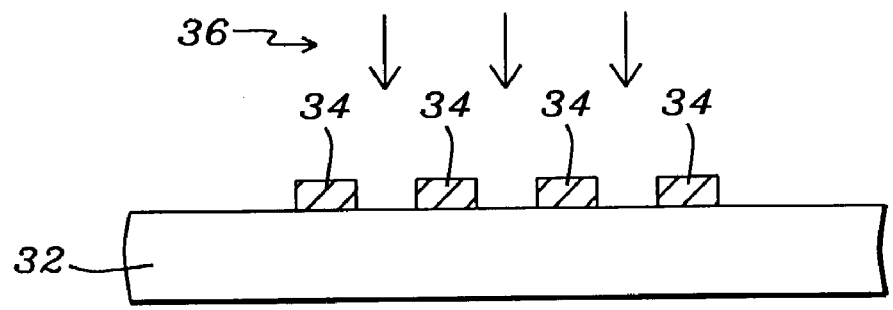
FIG. 3A shows a cross section view of a dark tone mask of this invention used to form a closely spaced array of contact holes.

FIG. 3A shows a cross section of a segment of an attenuating phase shifting mask used to form the closely spaced contact holes. The attenuating phase shifting mask in this invention is a dark tone mask which is to prevent the regions of the layer of resist where the contact holes are to be formed from being exposed. In this invention the layer of resist 24, see FIG. 2, in which the contact holes are to be formed is a layer of negative resist.

As shown in FIG. 3A, the mask segment has a number of attenuating phase shifting mask elements 34 formed on a transparent mask substrate 32. The attenuating phase shifting material forming the attenuating phase shifting mask elements 34 has a transmittance of at least 20% and between about 20% and 50% for light having a wavelength of the light 36 used to illuminate the mask. The attenuating phase shifting mask elements 34 have locations corresponding to the regions of the photoresist where the contact holes are to be formed. The attenuating phase shifting mask elements also provide a 180° phase shift for the light 36 used to illuminate the mask. In this example the light 36 used to illuminate the mask has a wavelength of 193 nanometers.

Figure 3B:
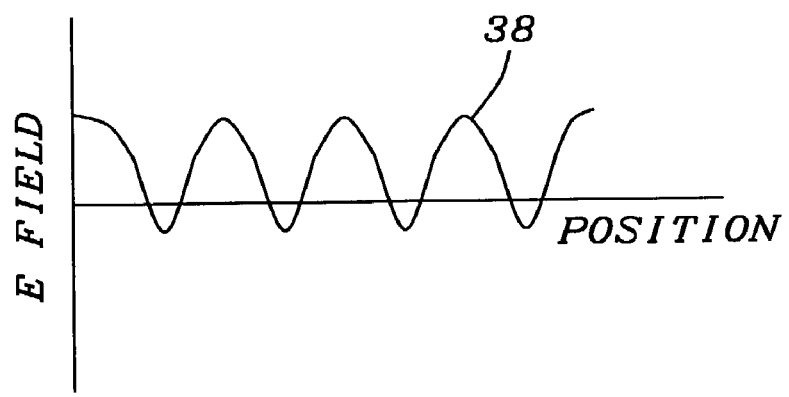
FIG. 3B shows a curve of the Electric Field of the light passing through the mask of FIG. 3A as a function of mask position.
Figure 3C:
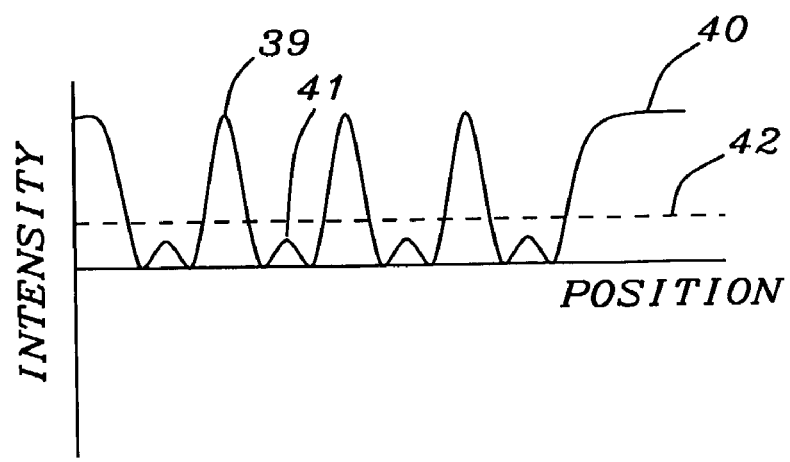
FIG. 3C shows a curve of the Intensity of the light passing through the mask of FIG. 3A as a function of mask position.

FIG. 3B shows a curve 38 of the Electric Field of the light 36 passing through the mask segment shown in FIG. 3A as a function of the position on the mask segment. As can be seen in FIG. 3B the attenuating phase shifting mask elements 34 attenuate and provide a 180° phase shift to the light passing through the attenuating phase shifting mask elements 34. FIG. 3C shows a curve 40 of the Intensity of the light passing through the mask segment shown in FIG. 3A as a function of the position on the mask segment. In FIG. 3C the higher peaks 39 relate to the light which has passed through the transparent mask substrate only and the smaller peaks 41 relate to the light which has passed through both the transparent mask substrate and the attenuating phase shifting mask elements. The dashed line 42 in FIG. 3C represents the exposure threshold for a layer of resist which will be exposed using this mask. As can be seen in FIG. 3C the intensity of the light passing through the attenuating phase shifting mask elements is not sufficient to expose the layer of resist.

Figure 4A:
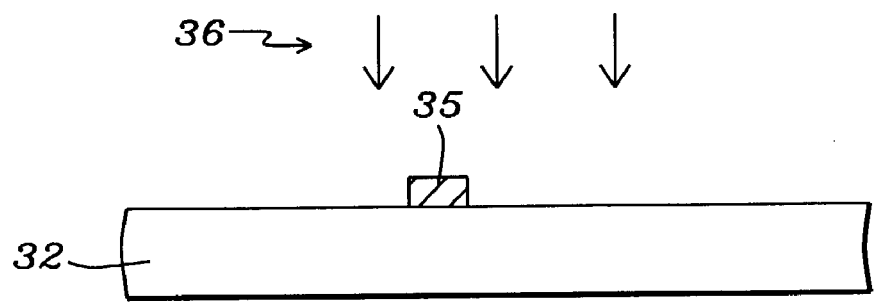
FIG. 4A shows a cross section view of a dark tone mask of this invention used to form isolated contact holes.

FIG. 4A shows a cross section of a segment of an attenuating phase shifting mask used to form an isolated contact hole. The attenuating phase shifting mask in this invention is a dark tone mask which is to prevent the regions of the layer of resist where the contact holes are to be formed from being exposed. In this invention the layer of resist 24, see FIG. 2, in which the contact holes are to be formed is a layer of negative resist.

As shown in FIG. 4A, the mask segment has an attenuating phase shifting mask element 35 formed on a transparent mask substrate 32. The attenuating phase shifting material forming the attenuating phase shifting mask element 35 has a transmittance of at least 20% and between about 20% and 50% for light having a wavelength of the light 36 used to illuminate the mask. The attenuating phase shifting mask element 35 has a location corresponding to the region of the photoresist where the isolated contact hole is to be formed. The attenuating phase shifting mask element 35 also provides a 180° phase shift for the light 36 used to illuminate the mask. In this example the light 36 used to illuminate the mask has a wavelength of 193 nanometers.

Figure 4B:
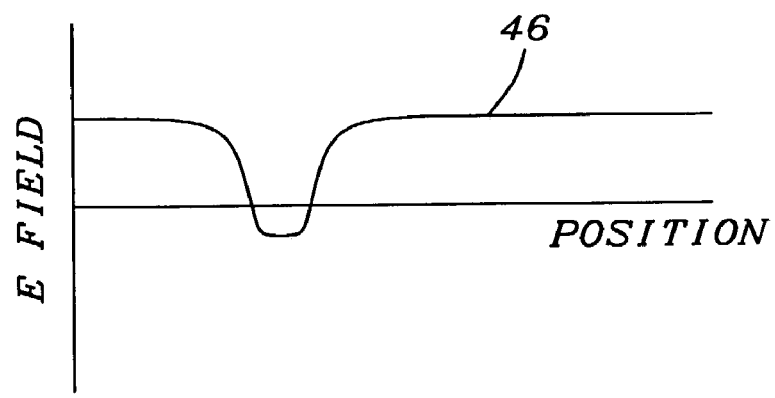
FIG. 4B shows a curve of the Electric Field of the light passing through the mask of FIG. 4A as a function of mask position.
Figure 4C:
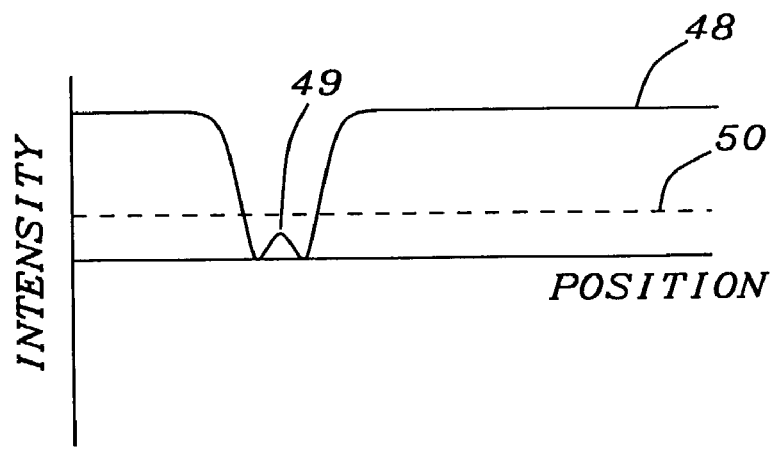
FIG. 4C shows a curve of the Intensity of the light passing through the mask of FIG. 4A as a function of mask position.

FIG. 4B shows a curve 46 of the Electric Field of the light 36 passing through the mask segment shown in FIG. 4A as a function of the position on the mask segment. As can be seen in FIG. 4B the attenuating phase shifting mask element 35 attenuates and provide a 180° phase shift to the light passing through the attenuating phase shifting mask elements 35. FIG. 4C shows a curve 48 of the Intensity of the light passing through the mask segment shown in FIG. 4A as a function of the position on the mask segment. In FIG. 4C the lower peak 49 relate to the light which has passed through both the transparent mask substrate and the attenuating phase shifting mask elements. The dashed line 50 in FIG. 4C represents the exposure threshold for a layer of resist which will be exposed using this mask. As can be seen in FIG. 4C the intensity of the light passing through the attenuating phase shifting mask element 35 is not sufficient to expose the layer of resist.

Figure 5:
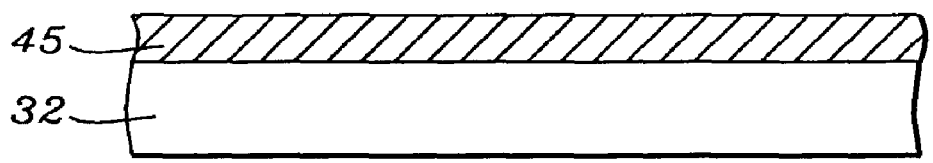
FIG. 5 shows a cross section view of an attenuating phase shifting mask blank.

FIG. 5 shows a cross section view of a mask blank used to form the mask of this invention. The mask blank has a transparent mask substrate 32 and a layer of attenuating phase shifting material 45 formed thereon. The attenuating phase shifting material 45 provides a 180° phase shift to light being used to illuminate the mask and has a transmittance of at least 20% and between about 20% and 50% for light being used to illuminate the mask. The transparent mask substrate 32 typically, but not necessarily, is quartz. As an example the attenuating phase shifting material can be aluminum oxide or nitride-based material. Typically, but not necessarily, the light used to illuminate the mask has a wavelength of 193 nanometers.

Figure 6:
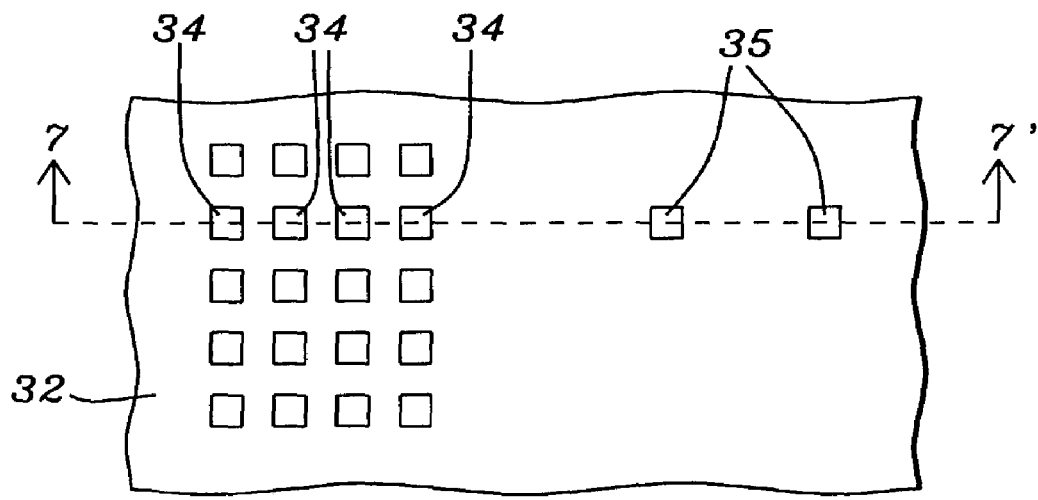
FIG. 6 shows a top view of a dark tone attenuating phase shifting mask of this invention.
Figure 7:
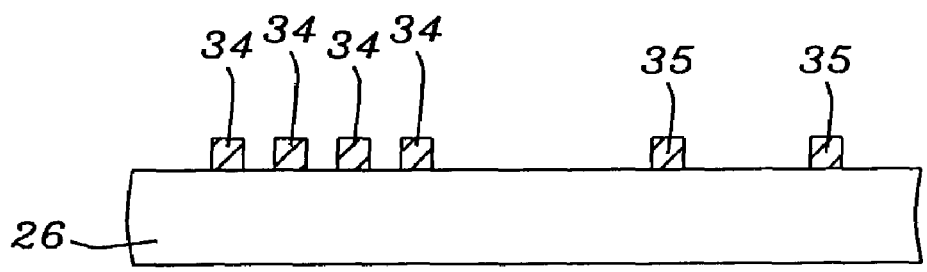
FIG. 7 shows a cross section view of the dark tone attenuating phase shifting mask of this invention shown in FIG. 6 taken along line 7–7' of FIG. 6.

FIG. 6 shows a top view and FIG. 7 a cross section view, taken along line 7–7' of FIG. 6, of the attenuating phase shifting mask of this invention, formed from the mask blank shown in FIG. 5. This mask will be used to produce the contact hole pattern in a layer of resist shown in FIG. 1. The mask is a dark tone mask, closely spaced attenuating phase shifting mask elements 34 are formed on the transparent mask substrate 32 to produce the closely spaced contact holes in a layer of negative resist, and isolated attenuating phase shifting mask elements 35 are formed on the transparent mask substrate 32 to produce isolated contact holes in the layer of negative resist.

Figure 8:
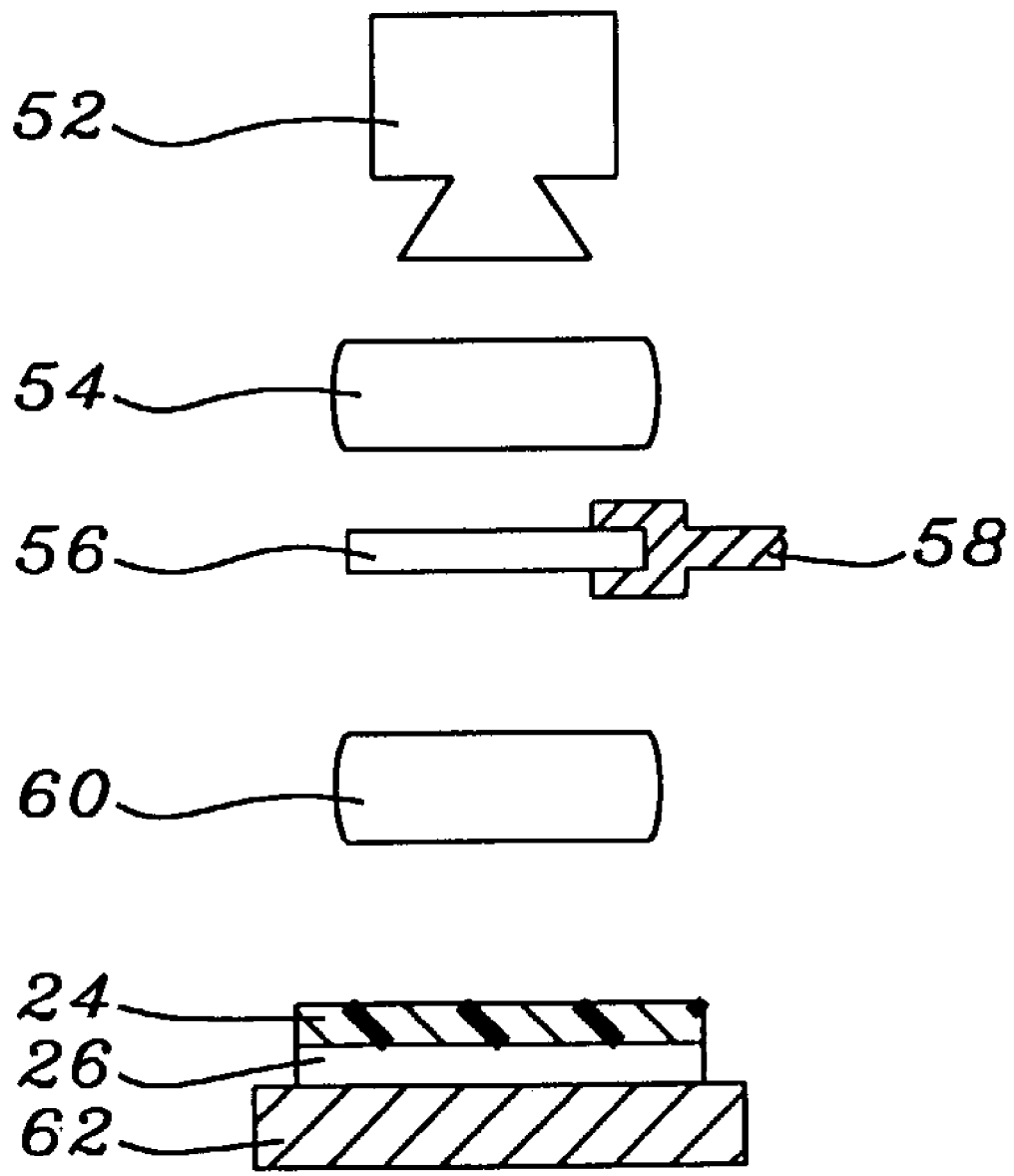
FIG. 8 shows a schematic view of a projection exposure system.

FIG. 8 shows a schematic diagram of a projection exposure system which could be used to form the contact holes in a layer of resist. A substrate 26 having a layer of negative resist 24 formed thereon is placed on a substrate holder 62. The mask 56 shown in FIGS. 6 and 7 is placed in a mask holder 58. Light from a light source 52 passes through a condensing lens 54, the mask 56, an objective lens 60, is focused on the layer of resist 24, and exposes the layer of resist. The layer of resist 24 is then developed and the contact holes shown in FIGS. 1 and 2 are formed.

The attenuating phase shifting mask of this invention provides an improved depth of focus which improves the process latitude for the formation of the contact holes. Good quality contact holes have been formed using the attenuating phase shifting mask of this invention, a projection exposure system such as shown in FIG. 8, and a focus distance of +/−0.3 micrometers away from the optimum focus distance. This provides a depth of focus of +/−0.3 micrometers.

While the invention has been particularly shown and described with reference to the preferred embodiments thereof, it will be understood by those skilled in the art that various changes in form and details may be made without departing from the spirit and scope of the invention.

What is claimed is:

1. A method of forming a contact hole mask, comprising:
providing a transparent mask substrate having a first number of contact hole regions; and
forming attenuating phase shifting material on each of said contact hole regions of said transparent mask substrate, wherein said attenuating phase shifting material is configured such that ambient light is no prevented from reaching the attenuating phase shifting material.

2. The method of claim 1 wherein said attenuating phase shifting material has a transmittance of at least 20% for light having a first wavelength of 193 nanometers.

3. The method of claim 1 wherein said attenuating phase shifting material has a transmittance of between 20% and 50% for light having said first a wavelength.

4. The method of claim 1 wherein said attenuating phase shifting material formed on each of said contact hole regions of said transparent mask substrate can be used to form a contact hole pattern in a layer of resist wherein said contact hole pattern in a layer of resist comprises isolated contact holes, said isolated contact holes having a width of about 0.1 micrometers, and the space between adjacent said isolated contact holes is at least 0.5 micrometers.

5. The method of claim 1 wherein said attenuating phase shifting material provides a 180° phase shift for light having said first wavelength.

6. The method of claim 5 wherein said layer of resist is a layer of negative resist.

7. The method of claim 1 wherein said attenuating phase shifting material formed on each of said contact hole regions of said transparent mask substrate can be used to form a contact hole pattern in a layer of resist wherein said contact hole pattern is layer of resist comprises isolated contact holes, said isolated contact holes having a width of about 0.1 micrometers, and the space between adjacent said isolated contact holes is about 0.1 or above 0.1 micrometers.

8. The method of claim 7 wherein said layer of resist is a layer of negative resist.

9. The method of claim 1 wherein said attenuating phase shifting material is aluminum oxide or a nitride-based material.

10. A method of forming contact holes in a layer of resist, comprising:
providing a substrate;
forming a layer of resist on said substrate, wherein said layer of resist has a first number of contact hole regions;
providing a mask comprising a transparent mask substrate having a first number of contact hole regions and attenuating phase shifting material formed on each of said contact hole regions of said transparent mask substrate, wherein said attenuating phase shifting material is configured such that ambient light is no prevented from reaching the attenuating phase shifting material;
exposing a contact hole pattern on said layer of resist using said mask and light having said first wavelength, whereby said contact hole regions in said layer of resist remain unexposed and the remainder of said layer of resist is exposed; and
developing said layer of resist thereby forming said first number of contact holes in said layer of resist.

11. The method of claim 10 wherein said substrate is an integrated circuit wafer having devices formed therein.

12. The method of claim 10 wherein said layer of resist is a layer of negative resist.

13. The method of claim 10 wherein said attenuating phase shifting material has a transmittance of between 20% and 50%.

14. The method of claim 10 wherein said contact hole pattern comprises isolated contact holes, said contact holes have a width of about 0.1 micrometers, and the space between adjacent said contact holes is at least 0.5 micrometers.

15. The method of claim 10 wherein said contact hole pattern comprises contact holes arranged in an array, said contact holes have a width of about 0.1 micrometers, and the space between adjacent said contact holes is about 0.1 or above 0.1 micrometers.

16. The method of claim 10 wherein said attenuating phase shifting material has a transmittance of at least 20% for light having a first wavelength of 193 nanometers.

17. The method of claim 10 wherein said attenuating phase shifting material is aluminum oxide or a nitride-based material.

18. The method of claim 10 wherein said attenuating phase shifting material provides a 180° for light having said first wavelength.

19. The method of claim 10 wherein said exposing a contact hole pattern use said mask and a projection exposure system.

20. A mask for forming contact holes in a layer of resist, comprising:
a transparent mask substrate having a first number of contact hole regions; and
attenuating phase shifting material formed on each of said contact hole regions of said transparent mask substrate, wherein said attenuating phase shifting material is configured such that ambient light is no prevented from reaching the attenuating phase shifting material.

21. The mask of claim 20 wherein said attenuating phase shifting material has a transmittance of at least 20% for light having a first wavelength of 193 nanometers.

22. The mask of claim 20 wherein said attenuating phase shifting material has a transmittance of between 20% and 50% for light having said first wavelength.

23. The mask of claim 20 wherein said attenuating phase shifting material provides a 180° phase shift for light having said first wavelength.

24. The mask of claim 20 wherein said attenuating phase shifting material formed on each of said contact hole regions of said transparent mask substrate can be used to form a contact hole pattern in a layer of resist wherein said contact hole pattern is a layer of resist comprises isolated contact holes, said isolated contact holes having a width of about 0.1 micrometers, and the space between adjacent said isolated contact holes is at least 0.5 micrometers.

25. The mask of claim 24 wherein said layer of resist is a layer of negative resist.

26. The mask of claim 24 wherein said attenuating phase shifting material formed on each of said contact hole regions of said transparent mask substrate can be used to form a contact hole pattern in a layer of resist wherein said contact hole pattern is a layer of resist comprises isolated contact holes, said isolated contact holes having a width of about 0.1 micrometers, and the space between adjacent said isolated contact holes is about 0.1 or above micrometers.

27. The mask of claim 26 wherein said layer of resist is a layer of negative resist.

28. The method of claim 20 wherein said attenuating phase shifting material is aluminum oxide or a nitride-based material.

* * * * *